(12) United States Patent
Miura et al.

(10) Patent No.: US 11,271,372 B2
(45) Date of Patent: Mar. 8, 2022

(54) OPTICAL APPARATUS

(71) Applicant: NICHIA CORPORATION, Anan (JP)

(72) Inventors: Soichiro Miura, Tokushima (JP); Kazuma Kozuru, Tokushima (JP)

(73) Assignee: NICHIA CORPORATION, Anan (JP)

( * ) Notice: Subject to any disclaimer, the term of this patent is extended or adjusted under 35 U.S.C. 154(b) by 33 days.

(21) Appl. No.: 16/944,027

(22) Filed: Jul. 30, 2020

(65) Prior Publication Data

US 2020/0358255 A1 Nov. 12, 2020

Related U.S. Application Data

(63) Continuation of application No. 16/545,939, filed on Aug. 20, 2019, now Pat. No. 10,770,866, which is a
(Continued)

(51) Int. Cl.
*H01S 5/00* (2006.01)
*H01S 5/40* (2006.01)
(Continued)

(52) U.S. Cl.
CPC .......... *H01S 5/4081* (2013.01); *H01S 5/0225* (2021.01); *H01S 5/02253* (2021.01);
(Continued)

(58) Field of Classification Search
CPC .... H01S 5/4093; H01S 5/4087; H01S 5/4081; H01S 5/4025; H01S 5/4012; H01S 5/40;
(Continued)

(56) References Cited

U.S. PATENT DOCUMENTS

2003/0214987 A1* 11/2003 Yamanaka ............ H01S 5/4012
372/43.01
2004/0027631 A1* 2/2004 Nagano ................ G02B 6/4249
372/36
(Continued)

FOREIGN PATENT DOCUMENTS

JP 2000-242192 A 9/2000
JP 2004-047650 A 2/2004
(Continued)

OTHER PUBLICATIONS

Notice of Allowance in the related U.S. Appl. No. 16/141,542 dated May 22, 2019.
(Continued)

*Primary Examiner* — Kinam Park
(74) *Attorney, Agent, or Firm* — Global IP Counselors, LLP

(57) ABSTRACT

An optical apparatus includes a light emitting device and a substrate. The light emitting device includes a base including a main body portion containing a ceramic material and wire portions exposed from the main body portion on the lower surface of the base, a lid portion fixed to the base so that a hermetically sealed space is defined by the lid portion and the base, a first semiconductor laser element emitting blue light and provided in the hermetically sealed space, a second semiconductor laser element emitting red light and provided in the hermetically sealed space, a third semiconductor laser element emitting green light and provided in the hermetically sealed space, and a collimate lens arranged on paths of the blue light, the red light and the green light. The substrate includes first metallic films electrically connected with the base of the light emitting device via the wire portions.

15 Claims, 15 Drawing Sheets

Related U.S. Application Data continuation of application No. 16/141,542, filed on Sep. 25, 2018, now Pat. No. 10,431,959.

(60) Provisional application No. 62/566,659, filed on Oct. 2, 2017.

(51) Int. Cl.
| | |
|---|---|
| *H01S 5/0225* | (2021.01) |
| *H01S 5/02253* | (2021.01) |
| *H01S 5/02255* | (2021.01) |
| *H01S 5/02257* | (2021.01) |
| *H01S 5/323* | (2006.01) |
| *H01S 5/024* | (2006.01) |
| *H01S 5/02216* | (2021.01) |
| *H01S 5/0222* | (2021.01) |
| *H01S 5/02326* | (2021.01) |

(52) U.S. Cl.
CPC ...... *H01S 5/02255* (2021.01); *H01S 5/02257* (2021.01); *H01S 5/40* (2013.01); *H01S 5/4012* (2013.01); *H01S 5/4025* (2013.01); *H01S 5/0071* (2013.01); *H01S 5/0222* (2013.01); *H01S 5/02216* (2013.01); *H01S 5/02326* (2021.01); *H01S 5/02469* (2013.01); *H01S 5/32308* (2013.01); *H01S 5/32325* (2013.01); *H01S 5/32341* (2013.01); *H01S 5/4031* (2013.01); *H01S 5/4087* (2013.01); *H01S 5/4093* (2013.01)

(58) Field of Classification Search
CPC .............. H01S 5/0228; H01S 5/02288; H01S 5/02292; H01S 5/32325; H01S 5/32341; H01S 5/32308
See application file for complete search history.

(56) References Cited

U.S. PATENT DOCUMENTS

| | | | |
|---|---|---|---|
| 2006/0222042 A1* | 10/2006 | Teramura | H01S 5/02325 372/101 |
| 2009/0129420 A1* | 5/2009 | Regaard | G02B 19/0028 372/50.12 |
| 2014/0168971 A1* | 6/2014 | Kurosaki | G03B 21/208 362/235 |
| 2016/0341395 A1* | 11/2016 | Kiyota | F21V 5/007 |
| 2017/0122505 A1 | 5/2017 | Kiyota et al. | |
| 2017/0207606 A1* | 7/2017 | Nakanishi | H01S 5/32316 |
| 2017/0317467 A1* | 11/2017 | Miura | H01S 5/02326 |
| 2017/0363941 A1* | 12/2017 | Sugiyama | G03B 33/08 |
| 2019/0372312 A1 | 12/2019 | Miura et al. | |

FOREIGN PATENT DOCUMENTS

| | | |
|---|---|---|
| JP | 2004-252425 A | 9/2004 |
| JP | 2006-202998 A | 8/2006 |
| JP | 2006-284851 A | 10/2006 |
| JP | 2007-019301 A | 1/2007 |
| JP | 2007-304311 A | 11/2007 |
| JP | 2010-170755 A | 8/2010 |
| JP | 2013-073079 A | 4/2013 |
| JP | 2014-109692 A | 6/2014 |
| JP | 2014-123518 A | 7/2014 |
| JP | 2016-071234 A | 5/2016 |
| JP | 2016-219779 A | 12/2016 |
| JP | 2016-225448 A | 12/2016 |
| JP | 2017-103271 A | 6/2017 |

OTHER PUBLICATIONS

Notice of Allowance in the related U.S. Appl. No. 16/545,939 dated May 1, 2020.

* cited by examiner

OPTICAL APPARATUS

CROSS-REFERENCE TO RELATED APPLICATIONS

This application is a continuation application of U.S. application Ser. No. 16/545,939, filed on Aug. 20, 2019, which is a continuation application of U.S. application Ser. No. 16/141,542, filed on Sep. 25, 2018, now U.S. Pat. No. 10,431,959, which claims priority to U.S. Provisional Application No. 62/566,659 filed on Oct. 2, 2017. The entire disclosures of U.S. Provisional Application No. 62/566,659 and U.S. application Ser. Nos. 16/141,542 and 16/545,939 are hereby incorporated herein by reference.

TECHNICAL FIELD

The present invention relates to a light emitting device and an optical apparatus.

BACKGROUND ART

With respect to a light emitting device having two or more semiconductor laser elements that have different peak wavelengths, a light emitting device, in which lights from the semiconductor laser elements are entered into a collimate lens to create approximately parallel light, has been known (e.g., FIG. 6 of Japanese Laid-Open Patent Publication 2000-242192)

SUMMARY

It is difficult to make the lights from the semiconductor laser elements approximately parallel light with high accuracy with such light emitting device. Also, in order to make the lights approximately parallel light, distance from a light emission end face of each of the semiconductor laser elements to a collimate lens needs to be large and the size of the collimate lens itself has to be large.

An optical apparatus according to one embodiment includes a light emitting device and a substrate. The light emitting device includes a base including a main body portion containing a ceramic material and wire portions exposed from the main body portion on the lower surface of the base, a lid portion fixed to the base so that a hermetically sealed space is defined by the lid portion and the base, a first semiconductor laser element emitting blue light and provided in the hermetically sealed space, a second semiconductor laser element emitting red light and provided in the hermetically sealed space, a third semiconductor laser element emitting green light and provided in the hermetically sealed space, and a collimate lens arranged on paths of the blue light, the red light and the green light. The substrate includes first metallic films electrically connected with the base of the light emitting device via the wire portions.

BRIEF DESCRIPTION OF THE DRAWINGS

FIG. 9 is a view of a substrate from the surface side, which the light emitting device is mounted on.

DETAILED DESCRIPTION OF EMBODIMENTS

The embodiments for implementing the present invention will be described with reference to the accompanying drawings. However, the embodiments explained below is intended for embodying the technical concept of the present invention and is not for limiting the present invention. We note that size or positional relationship of elements shown in each figure can be exaggerated for the sake of clarity.

In the present specification, a plurality of semiconductor laser elements (hereinafter, "LD elements") are called a first LD element 21, a second LD element 22 and a third LD element 23 according to the order of alignment. Therefore, the peak wavelength of a LD element can be different depending on the embodiment, even when it is referred with the same term. The same can be said for lens portions, and the peak wavelength of a light passes through a lens portion can be different depending on the embodiment.

In the following embodiments, the light extracting surface side (the upper side of FIG. 3) of the light emitting device is the upside and the opposite side (the lower side of FIG. 3) from the light extracting surface side of the light emitting device is the downside.

First Embodiment

Figure 1:
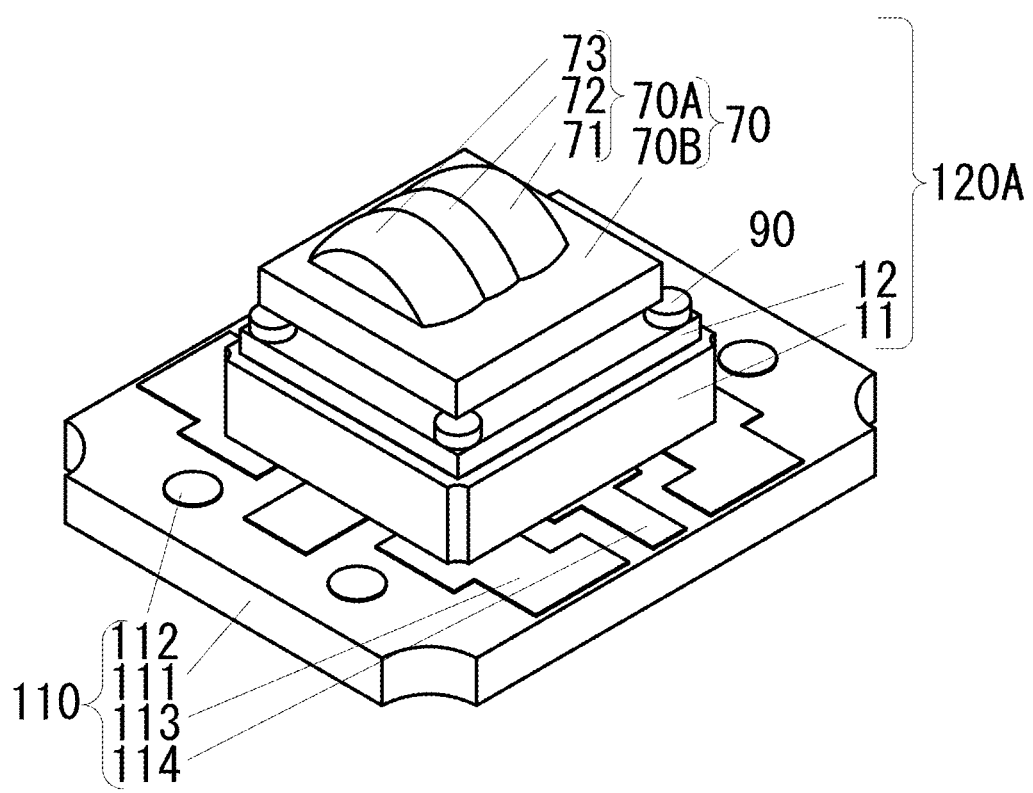
FIG. 1 is a perspective view of a light emitting device according to a first embodiment.
Figure 2:
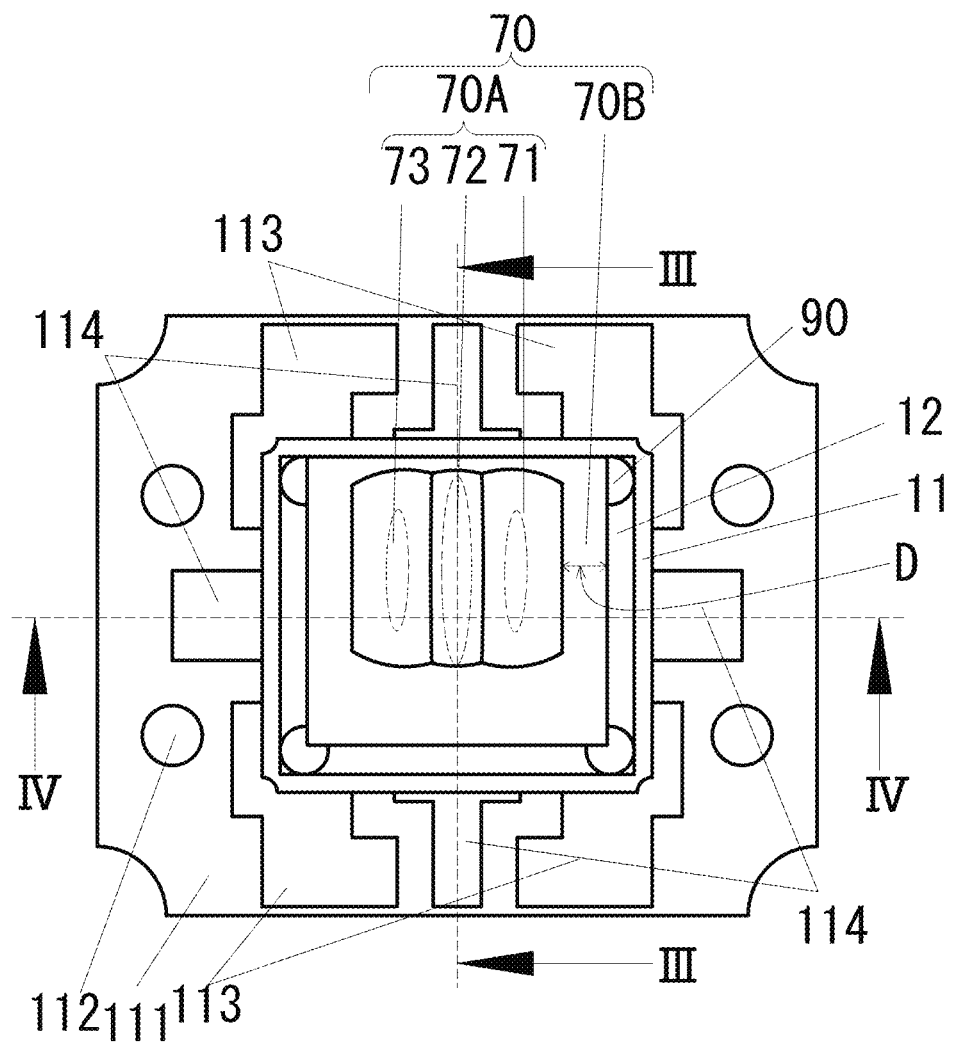
FIG. 2 is a view from the light extracting surface side of the light emitting device according to the first embodiment.
Figure 3:
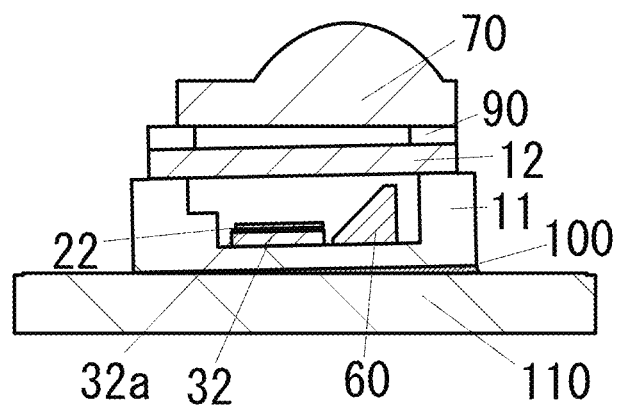
FIG. 3 is a section view along of FIG. 2.
Figure 4:
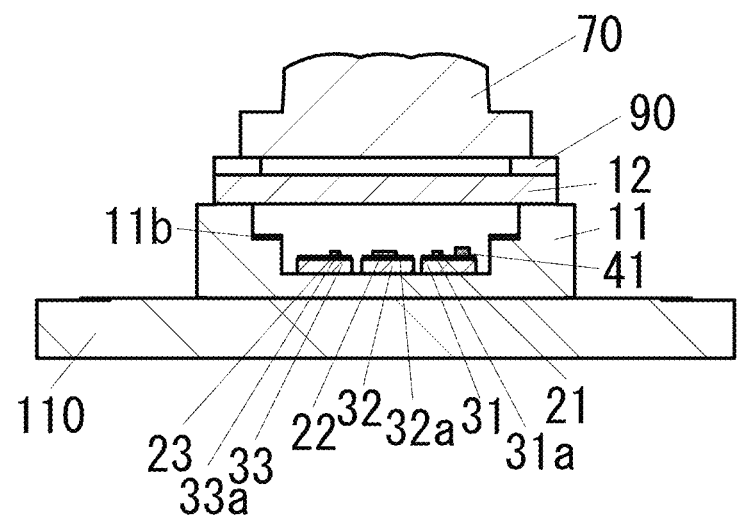
FIG. 4 is a section view along IV-IV of FIG. 2.
Figure 5:
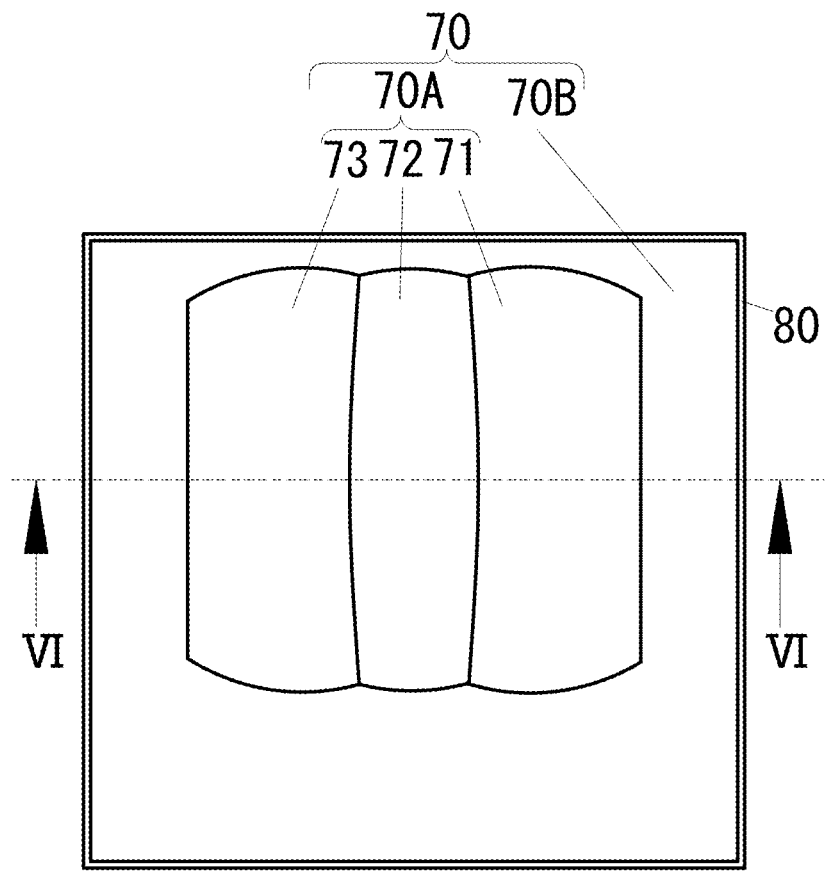
FIG. 5 is a view of a collimate lens and others from the light extracting surface side.
Figure 6:
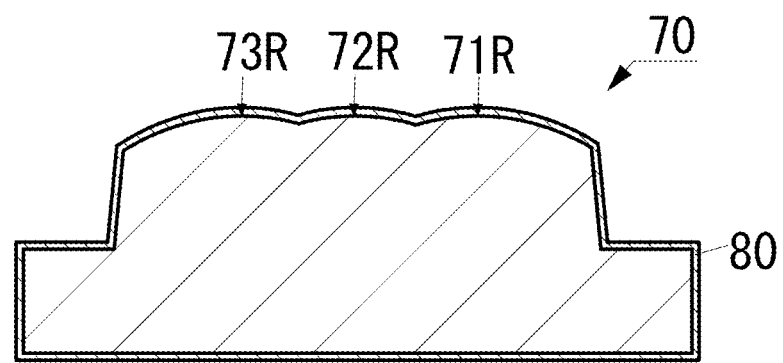
FIG. 6 is a section view along VI-VI of FIG. 5.
Figure 7:
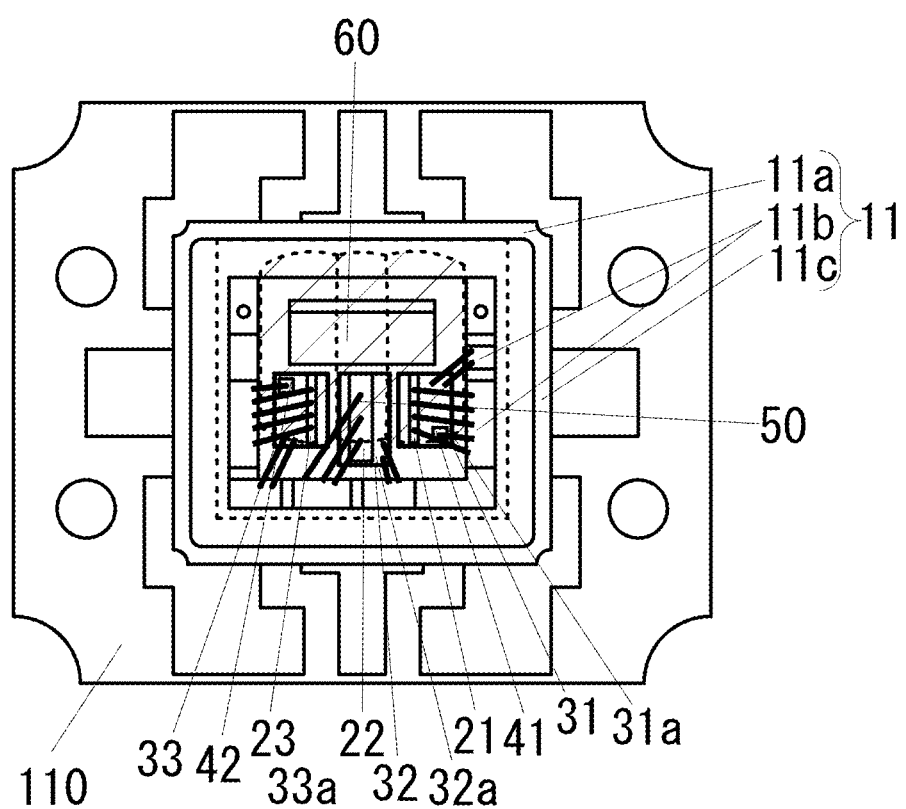
FIG. 7 is a view to describe inside of a recess of a base of the light emitting device according to the first embodiment.
Figure 8:
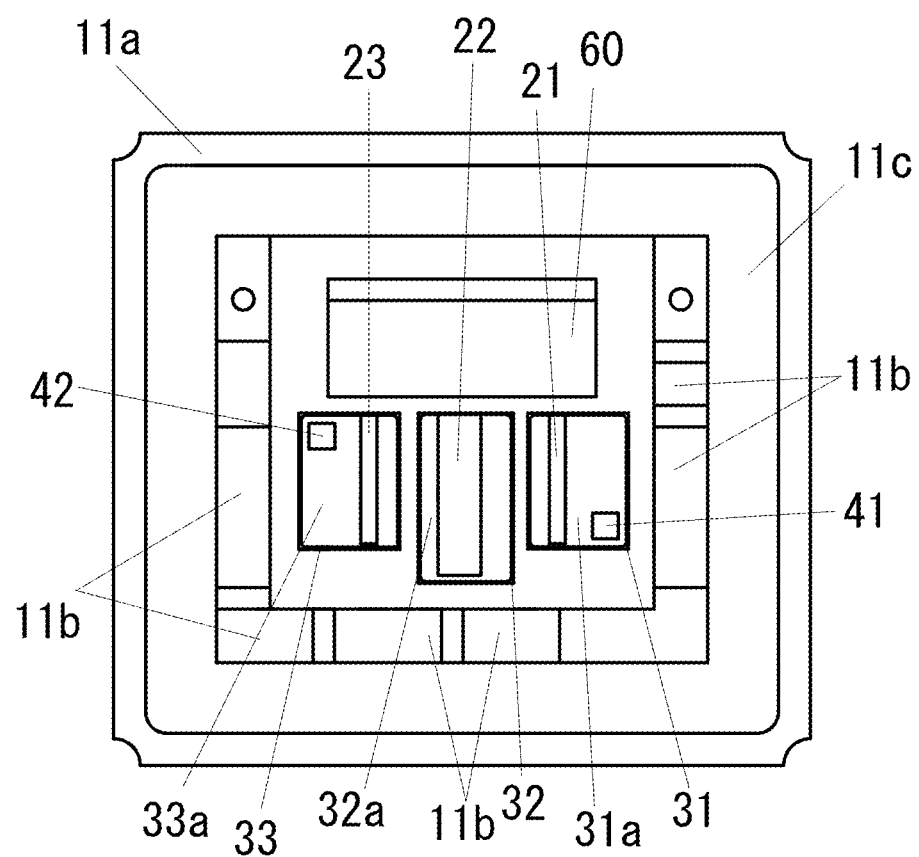
FIG. 8 is a view to describe inside of the recess of the base of the light emitting device according to the first embodiment.
Figure 9:
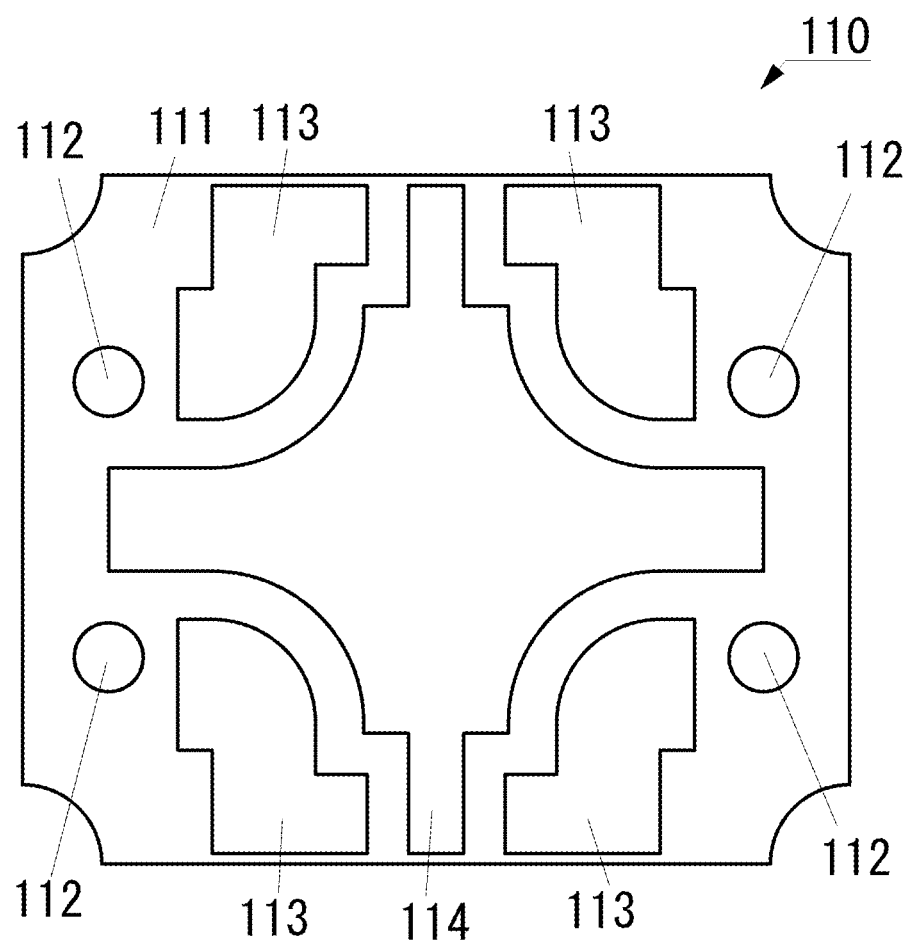

FIG. 1 is a perspective view of a light emitting device 120A and a substrate 110 according to a first embodiment, FIG. 2 is a top view of the light emitting device 120A and the substrate 110, FIG. 3 is a section view along III-III of FIG. 2, and FIG. 4 is a section view along IV-IV of FIG. 2. Additionally, FIG. 5 is a top view of a collimate lens 70 and an antireflection film 80 of the light emitting device 120A, and FIG. 6 is a section view along VI-VI of FIG. 5. Moreover, FIG. 7 is a top view to describe inside of a recess of a base 11 and FIG. 8 is a view to describe the configuration of inside of the recess. Meanwhile, wires (fine metal wires) 50 are omitted in FIG. 3, FIG. 4 and FIG. 8 to clarify the location of each elements. FIG. 9 is a top view of the substrate 110.

As shown in FIG. 1-FIG. 8, the light emitting device 120A includes a first LD element 21 that irradiates a first light having a peak wavelength in a visible range, a second LD element 22 that irradiates a second light having a peak wavelength in a visible range, which is different from the peak wavelength of the first light, a third LD element 23 that irradiates a third light having a peak wavelength in a visible range, which is different from the peak wavelengths of the first light and the second light, and a collimate lens 70 provided on the path of the first light, the second light and the third light. The collimate lens 70 has a plurality of lens portions 70A which include a first lens portion 71 through which the first light passes, a second lens portion 72 that is arranged to be connected to the first lens portion 71, and through which the second light passes, and a third lens portion 73 that is arranged to be connected to the second lens portion 72 on the opposite side from the side where the first lens portion 71 is provided, and through which the third light passes. The first lens portion 71, the second lens portion 72 and the third lens portion 73 are respectively different from each other in at least one of the shapes of light incident surfaces and the shapes of light extracting surfaces.

It is possible to make the first light and the second light approximately parallel light with high accuracy with the light emitting device 120A. Also, a relatively small collimate lens can be arranged closely to LD so that the whole device can be made small. The details will follow.

On the surface parallel to a light emission end face of the LD element, radiation light of the LD element has an elliptical Far-Field Pattern (hereinafter, "FFP") in which the length of the radiation light in the lamination direction of a plurality of semiconductor layers including an active layer is longer than the length of the radiation light in the direction perpendicular to the lamination direction. The term FFP as used herein is a distribution of light intensity of the radiation light, which is measured on the surface parallel to and far enough from the light emission end face, and for example, it is identified as a shape at a point where the intensity of the radiation light drops to a given intensity, such as 13.5%, from the peak intensity value. The light tends not to spread on the shorter side direction of FFP, thus, the LD elements can be arranged close to each other. If all of the LD lights are transmitted through one lens portion, there is a possibility that an irregularity occurs in the spread angles of the lights with respect to the LD lights due to the difference in the peak wavelengths of the LD elements, and thus, all of the LD lights may not be made approximately parallel light. In order to make all of the LD lights approximately parallel light, the light path needs to be long enough from the light emission end faces of the LD elements to the lens. However, if the path is made long, the lens needs to be large, which may result in the whole device becoming bulky. In contrast, with the light emission device 120A, the collimate lens 70 has the plurality of lens portions 70A and at least one of the shapes of the light incident surfaces and the shapes of the light extracting surfaces of the lens portions are different from each other, thus, it is possible to make the lights extracted from each lens portions approximately parallel light with high accuracy while arranging the lens portions close to each other. Moreover, if all of the LD lights pass through a single lens portion, there is a possibility that all of the LD lights are not made approximately parallel light because variation may occur in the tilt angles of the LD lights. In contrast, since the light emitting device 120A of the embodiment has the collimate lens 70 having the structures as described above, it is possible to make the lights extracted from each lens portions approximately parallel light with high accuracy.

The Components of the Light Emitting Device 120A is Described Below.

(Base 11)

Each LD elements and others are mounted on the base 11. As shown in FIG. 3 and FIG. 4, a recess is provided in the base 11. As shown in FIG. 7 and FIG. 8, the base 11 includes a main body portion 11a, a wire portion 11b exposed from the main body portion 11a inside of the recess of the base 11 and on the lower surface of the base 11, and a metallic film 11c provided on the top surface of the main body portion 11a. The base 11 is electrically connected to the substrate 110 via the wire portion 11b exposed from the main body portion 11a on the lower surface of the base 11, and each LD elements are electrically connected to the wire portion 11b inside of the recess. The main body portion 11a can be a member that contains ceramics. Ceramics can be, for example, aluminum oxide, aluminum nitride, silicon nitride or silicon carbide. Metals such as Cu, W, Au can be used for the wire portion 11b. Au and the like can be used for the metallic film 11c. The height from the lower surface to the upper surface of the base 11 can be in the range from 1 mm to 8 mm and the length of a side in a top surface view can be in the range from 3 mm to 15 mm. The length of a side in a top surface view may be in the range from 3 mm to 10 mm.

(Lid Portion 12)

A lid portion 12 is fixed on the base 11 to cover the recess of the base 11. The lid portion 12 includes a metallic film, and the metallic film is provided on the area on the lower surface of the lid portion 12, which contacts the base 11. The lid portion 12 is fixed on the base 11 via AuSn and the like. The space created by putting the lid portion 12 and the base 11 together, where each of the LD elements is provided is a hermetically sealed space. Accordingly, it is possible to suppress collection of dust, such as organic substances, on the light exiting surfaces of the LD elements provided inside of the recess. For the lid portion 12, for example, a piece of glass provided with a metallic film or a piece of sapphire provided with a metallic film can be used, and it is preferable to use a piece of sapphire provided with a metallic film. This is because sapphire is a material with relatively high refractive index, thus, it can suppress the diffusion of the lights before the lights enter the collimate lens 70. Therefore, the size of the collimate lens 70 can be reduced. Additionally, since sapphire has relatively high strength, it has a tolerance for breakage and it can ensure to keep the space where each of the LD elements is provided hermetically sealed.

(Semiconductor Laser Element)

The light emitting device 120A includes at least two LD elements that have different peak wavelengths. In this case, each of the LD elements has its peak wavelength in a visible range. Here, the light emitting device 120A includes three LD elements that have different peak wavelengths. Each LD element is arranged so that its light exiting surface is perpendicular to the bottom surface of the recess and the longitudinal direction of the oval shape of FFP is perpendicular to the bottom surface of the recess. Accordingly, the surfaces with large dimension of the LD elements can be arranged parallel to the bottom surface of the recess, and thus, heat generated in the LD elements can be diffused to the base 11 and the substrate 110 easily. The terms, "perpendicular" and "parallel," used here can include some degree of gradient caused by misalignment when the elements are mounted. For example, gradient under 5° can be included.

In the light emitting device 120A, the first LD element 21 is a blue light emitting LD element, the second LD element 22 is a red light emitting LD element and the third LD element 23 is a green light emitting LD element. Each of the LD elements contains nitride semiconductor.

The light emitting peak wavelength of the blue light emitting LD element is preferably within the range from 420 nm to 494 nm, and more preferably within the range from 440 nm to 475 nm. As the blue light emitting LD element, a GaN-based semiconductor including at least one of GaN, InGaN and AlGaN, for example, can be used.

The light emitting peak wavelength of the green light emitting LD element is preferably within the range from 495 nm to 570 nm, and more preferably within the range from 510 nm to 550 nm. As the green light emitting LD element, a GaN-based semiconductor including at least one of GaN, InGaN and AlGaN, for example, can be used.

The light emitting peak wavelength of the red light emitting LD element is preferably within the range from 605 nm to 750 nm, and more preferably within the range from 610 nm to 700 nm. As a red light emitting LD element, it can include an InAlGaP-based semiconductor or a GaAs-based semiconductor, for example. Here, a red light emitting LD element which has two or more waveguide regions is used. Particularly when the LD element includes a GaAs-based semiconductor, output of the LD element decreases more due to heat, compared to when including a GaN-based semiconductor. However, by increasing the waveguide region, decrease of output of the LD element can be reduced since the heat can be dispersed and the amount of heat generated in one waveguide region can be made less.

As shown in FIG. 7 and FIG. 8, when viewed from the light extracting surface of the collimate lens 70, shapes of the first LD element 21, the second LD element 22 and the third LD element 23 are rectangular and the short side of the second LD element 22, which is a red light emitting LD element, is longer than the short side of the first LD element 21 and the short side of the third LD element 23. By making the width of the second LD element 22 including an InAlGaP-based semiconductor or a GaAs-based semiconductor large, heat generated in the LD elements can be dispersed to the base 11 easily.

(Sub-Mount)

As shown in FIG. 4, FIG. 7 and FIG. 8, the first LD element 21 is mounted via a first sub-mount 31, the second LD element 22 is mounted via a second sub-mount 32, and the third LD element 23 is mounted via a third sub-mount 33 on the bottom surface of the recess of the base 11. As a result, it is possible to make the distance from a light emission point of the light exiting surface of each of the LD elements to the bottom surface of the recess large by the amount of a thickness of the sub-mount, therefore, the lights irradiated from the LD elements can be effectively irradiated on the light reflecting member 60. Metallic films 31a, 32a, 33a are respectively provided on the sub-mounts and the LD elements are respectively fixed on the sub-mounts with conductive layers such as Au—Sn.

For the sub-mounts, it is preferable to use the ones with coefficient of thermal expansion that is between the coefficient of thermal expansion of the base 11 and the coefficient of thermal expansion of each of the LD elements as this will suppress peeling of the LD elements or peeling of the sub-mounts. If a material contains a nitride semiconductor is used as a LD element, aluminum nitride or silicon carbide is used as a sub-mount, for example.

(Zener Diode)

Zener diodes (hereinafter, "ZD") is provided on the sub-mount on which the blue light emitting LD element containing GaN is mounted and on the sub-mount on which the green light emitting LD element containing GaN is mounted. A ZD is not provided on the sub-mount on which the red light emitting LD element containing an InAlGaP-based semiconductor or a GaAs-based semiconductor. In other words, as shown in FIG. 7 and FIG. 8, a first ZD 41 is provided on the first sub-mount 31, a second ZD 42 is provided on the third sub-mount 33, and no ZD is provided on the second sub-mount 32. Compared to GaN, GaAs is a material with less crystal defect and it has relatively high electrostatic withstand voltage, thus, electrostatic discharge is less likely to occur. The length of the base 11 in the direction along which LD elements are arranged can be made small by not providing ZD on the sub-mount on which the LD element in which electrostatic discharge is less likely to occur is mounted.

When the red light emitting LD element including an InAlGaP-based semiconductor or a GaAs-based semiconductor is arranged between the blue light emitting LD element and the green light emitting LD element, it is preferable to provide each of ZD on the far side from the red light emitting LD element. Here, the first ZD 41 is provided on the first LD element 21 on the opposite side of where the second LD element 22 is provided and the second ZD 42 is provided on the third LD element 23 on the opposite side of where the second LD element 22 is provided. Accordingly, the first LD element 21 and the third LD element 23 can be arranged close to the second LD element 22, and thus, the light exiting surface of the light emitting device 120A can be made small.

As shown in FIG. 7, each LD element and each ZD is electrically connected to the wire portion 11b provided in the recess via wire 50.

(Light Reflecting Member 60)

The light reflecting member 60 reflects the lights emitted from the LD elements towards the collimate lens 70. The light reflecting member 60 is provided on the bottom surface of the recess. By using the light reflecting member 60, the path of the lights from the light exiting surfaces of the LD elements to the light incident surface of the collimate lens 70 can be longer, compared to when the lights from the LD elements are directly irradiated on the collimate lens 70 without going through the light reflecting member 60. Therefore, the adverse effect caused by misalignment between the collimate lens 70 and each of the LD elements can be suppressed.

For the light reflecting member 60, an optical element having a light reflecting surface at least on one surface is used. The optical element can be a member made from a material including, as a main component, a heat-resistant material such as quartz, glass such as BK7, metal such as aluminum, or Si, and with a light reflecting surface made from a material having high degree of reflection, such as metal. In this embodiment, only one light reflecting member 60 is provided. However, two or more light reflecting members 60 can be used to reflect the light from each of the LD elements with each of the light reflecting members.

(Collimate Lens 70)

The collimate lens 70 is fixed on the top surface of the lid portion 12 with adhesive 90. For the collimate lens 70, for example, glass, such as "B270" manufactured by SCHOTT Corp. or "BK7" (borosilicate glass), can be used. The collimate lens 70 has the plurality of lens portions 70A including the first lens portion 71 through which the first light passes, and the second lens portion 72 arranged to be connected to the first lens portion 71 and through which the second light passes. Here, the plurality of lens portions 70A additionally includes the third lens portion 73 arranged to be connected to the second lens portion 72, and through which the third light passes. The collimate lens 70 as used herein includes not only the one that makes the light perfectly parallel with the plurality of lens portions 70A, but also the one that makes the light approximately parallel.

With the light emitting device 120A, the lights passed through the collimate lens 70 are made approximately parallel light by changing the curvature 71R of the first lens portion 71, the curvature 72R of the second lens portion 72 and the curvature 73R of the third lens portion 73, respectively. Although it may be possible to change the height of each lens portions, as stated below, in order to make the lights approximately parallel light, there is a possibility for the lenses to be broken when the thickness of the lenses is too thin. The diffusion of light passed through each of the lens portions, can be decreased while the breakage of the collimate lens 70 is suppressed by changing the curvature to make the light approximately parallel light. Here, a lens in which its light incident surface (lower surface) is planar, and at least the region on its top surface where the light is extracted is a curved surface is used as the collimate lens 70. Accordingly, the collimate lens 70 that can make the light approximately parallel light, can be easily manufactured.

The curvature of each lens portion becomes smaller as the peak wavelength of the light passes through the lens portion becomes shorter. In other words, in the light emitting device 120A, the curvature becomes smaller in the order corresponding to the second lens portion 72, the third lens portion 73 and the first lens portion 71. When the peak wavelength becomes longer, refractive index of the lens portion decreases and the refractive index difference with air becomes small, therefore, the light gets more difficult to be made approximately parallel light. The light is easily refracted to get close to the center by making the curvature of the lens portion through which light with long peak wavelength passes larger than the curvature of the lens portion through which light with short peak wavelength passes, therefore, each of the lights passed through the collimate lens 70 can be made approximately parallel light. The curvature of the lens portions can be measured, for example, by using a three-dimensional coordinate measuring machine. A three-dimensional coordinate measuring machine can be "UA3P" (manufactured by Panasonic Production Engineering Co., Ltd.), for example. The curvature can be found with a curve fitting software by measuring surface profile of each lens portions using such three-dimensional coordinate measuring machine. The curvature as used herein is the curvature of whole lens surface and not the curvature of a certain area of surface of the lens portion (lens surface).

A design value of each lens portions is shown in Table 1, when a collimate lens 70 composed of B270 is provided, the length from the lower surface of the collimate lens 70 to the top of each lens portions is 1.78 mm, the length of the light path when the light is irradiated on the lower surface of the collimate lens 70 from the light emitting end face of LD elements, is 2.05 mm and the peak wavelength of the first light is 455 nm, the peak wavelength of the second light is 525 nm and the peak wavelength of the third light is 639 nm, for example. Meanwhile, as shown in FIG. 3, since the lid portion 12 composed of sapphire with 0.5 mm thickness, is on the light path in this embodiment, effect of the refraction caused by the lid portion 12 is also considered. Conic, a4, a6, a8 and a10 in Table 1 describe the misalignment from a spherical surface and they decrease aberration, respectively. At this time, the shape of the lens surfaces can be obtained from sag amount evaluated from the formula below.

TABLE 1

|  | First Lens Portion 71 | Second Lens Portion 72 | Third Lens Portion 73 |
| --- | --- | --- | --- |
| Curvature (/mm) | 0.628 | 0.64 | 0.633 |
| K (Conic) | −0.879 | −0.869 | −0.873 |
| a4 | 0.012 | 0.012 | 0.012 |
| a6 | 7.92E−04 | 8.50E−04 | 8.16E−04 |
| a8 | 3.45E−04 | 3.87E−04 | 3.66E−04 |
| a10 | −3.56E−05 | −3.58E−05 | −3.58E−05 |

$$Z(s) = \frac{Cs^2}{1 + \sqrt{1 - (1+k)C^2 s^2}} + a_4 s^4 + a_6 s^6 + a_8 s^8 + a_{10} s^{10} \quad \text{[Formula 1]}$$

As shown in FIG. 5, when viewed from the light extracting surface side of the collimate lens 70, the collimate lens 70 has the plurality of lens portions 70A and the non-lens portion 70B surrounding the plurality of lens portions 70A. Here, the plurality of lens portions 70A and the non-lens portion 70B are formed integrally with the same material.

As shown in FIG. 7, when viewed from the light extracting surface side of the collimate lens 70, the plurality of lens portions 70A covers the whole light reflecting member 60 and parts of the first LD element 21, the second LD element 22 and the third LD element 23. The hatched area in FIG. 7 is the area where the plurality of lens portions 70A locates.

As shown with broken-line frames in FIG. 2, irradiation regions of the first light, the second light and the third light have oval shapes that are elongated in one direction, respectively, on the light incident surface of the collimate lens 70. The lens portion located on one end among the plurality of lens portions 70A, as shown in FIG. 1, has a planar surface which meets the non-lens portion on the opposite side of the lens portion located in the center, and the lens portion located on the other end among the plurality of lens portions has a planar surface which meets the non-lens portion on the opposite side of the lens portion located in the center. That is, as shown in FIG. 2, when viewed from the light extracting surface side of the collimate lens 70, an outer edge of the plurality of lens portions 70A has linear portions that intersect with the direction the lens portions are connected. The non-lens portion 70B is located on the outside of these linear portions. The dimension of the non-lens portion 70B can become large by providing such planar surfaces on the plurality of lens portions 70A, therefore, it is made easy to suck the collimate lens 70 with a collet when mounting the collimate lens 70. When viewed from the light extracting surface side of the collimate lens 70, it is preferable that the shortest distance from the straight lines of the outer edge of the plurality of lens portions 70A to the outer edge of the collimate lens 70 ("D" in FIG. 2) is within the range from 0.5 mm to 1 mm. By making the shortest distance 0.5 mm and up, the collimate lens 70 is easier to be sucked with the collet and by making the shortest distance not greater than 1 mm, the collimate lens 70 can be avoided to become bulky.

The collimate lens 70 can be obtained by forming a plurality of collimate lenses that are connected with a lens molding die and then, laser scribing and breaking the lens. Irregularity of curvature with respect to each collimate lens 70 can be reduced by being molded with the mold. At this time, because the lens portion located on one end of the plurality of lens portions 70A and the lens portion located on the other end of the plurality of lens portions 70A have planar surfaces, it is possible to increase the number of collimate lenses 70 that can be produced at once, compared to when the lens portions located on both ends do not have planar surfaces. Also, when a collimate lens 70 is singulated by laser scribing and breaking, the outer edge of the collimate lens does not have a preferable shape at times, compared to when molded with a die. Even when this is the case, by having the above-described planar surfaces, the lid portion 12 can be fixed by aligning with the reference line such as the outer edge of the base 11, while using the planar surfaces as the reference, thus, mounting accuracy can be improved. The collimate lens 70 is supported by sucking the top surface of the non-lens portion while the collet is pressed against on the planer surfaces, when mounted. The collimate lens 70 can be obtained by being singulated by dicing.

For adhesive 90, it is preferable to use ultraviolet curable resin. That is because ultraviolet curable resin can be hardened in relatively short time without being heated and the collimate lens 70 can be easily fixed on the preferable position while adjusting the divergence and the angle of the lights passed through the collimate lens 70.

It is preferable to fix the collimate lens 70 after mounting the base 11 on which the lid portion 12 is fixed, on the substrate 110. As shown in FIG. 3, when the base 11 is fixed on the substrate 110 via a conductive member 100, thickness of the conductive member 100 can be uneven and that can cause the lower surface of the substrate 110 and the lower surface of the base 11 being not parallel. By adjusting the position of the collimate lens 70 after fixing the base 11 on the substrate 110, the collimate lens 70 can be fixed while adjusting the position of the collimate lens 70, thus, deviation of an optical axis after passing through the collimate lens 70 can be reduced.

(Antireflection Film 80)

An enlarged view of the collimate lens 70 is shown in FIG. 5. As shown in FIG. 5, it is preferable to provide the antireflection film 80 on the light incident surface and the light extracting surface of the collimate lens 70 to let the lights from LD elements easily be transmitted. In the light emitting device 120A, an antireflection film 80 that has higher transmittance with the light which has the longest peak wavelength than the light which has other peak wavelength among the lights from the LD elements that are provided inside an air-tight space, is provided. Here, the antireflection film 80 that has higher transmittance with the red light emitting LD element than the other LD elements, is provided. Generally, an antireflection film reduces reflected light by inverting the phases of the light reflecting on the surface and the light reflecting on the other surface of the layer that configures the antireflection film and negating the effect mutually. At this time, if reflected light is reduced by controlling film thickness according to the peak wavelength, when the film transmits the lights with a plurality of peak wavelength, it is difficult to uniformly transmit the lights with all of the wavelength with high transmission since the most appropriate film thickness for each wavelengths differs from each other. Additionally, a red light emitting LD element including an InAlGaP-based semiconductor or a GaAs-based semiconductor, generates heat when output is too high and the characteristic feature of the LD element can be easily deteriorated, therefore, the output for the red light emitting LD element cannot be increased so much. Thus, the situation in which the red light passed through the collimate lens 70 is low, can be reduced by having a design that is easy for red light to be transmitted, for example, by controlling the film thickness to have high transmission for red light, while maintaining the characteristic feature of the red light emitting LD element.

For the antireflection film 80, a multi-layer film in which at least two types of dielectric layers are layered, such as silicon oxide, niobium oxide, aluminum oxide, aluminum nitride, titanium oxide, tantalum oxide, can be used. Meanwhile, the antireflection film 80 can be a film that is capable to reduce reflection and not limited to a film which completely prevents reflection of exciting light entered from the lower side. The antireflection film 80 can be formed by sputtering or vapor-deposition method. The antireflection film 80 may be provided on one of the light incident surface and the light extracting surface of the collimate lens 70.

(Substrate 110)

As shown in FIG. 9, the substrate 110 including a ceramics 111, through-holes 112 to secure the substrate 110 with screws, metallic films 113 to electrically connect with the light emitting device 120A and a metallic film 114 to secure the substrate 11 can be used. For the ceramics 111, the same material presented for the base 11 can be used. For the conductive member 100, for example, solder such as Au—Sn can be used. It is preferable to provide the metallic film 114 on the broadest possible range of where the base 11 is mounted. Accordingly, it is possible to make the interface of the base 11 and the substrate 110 large, thus, it is easy to exhaust heat from the base 11 to the substrate 110. When securing the base 11 on the substrate 110, it is preferable to arrange the metallic film 114 so that a part of it locates on the outside of the outer rim of the base 11, to let the excess conductive member 100 out.

Second Embodiment

Figure 10:
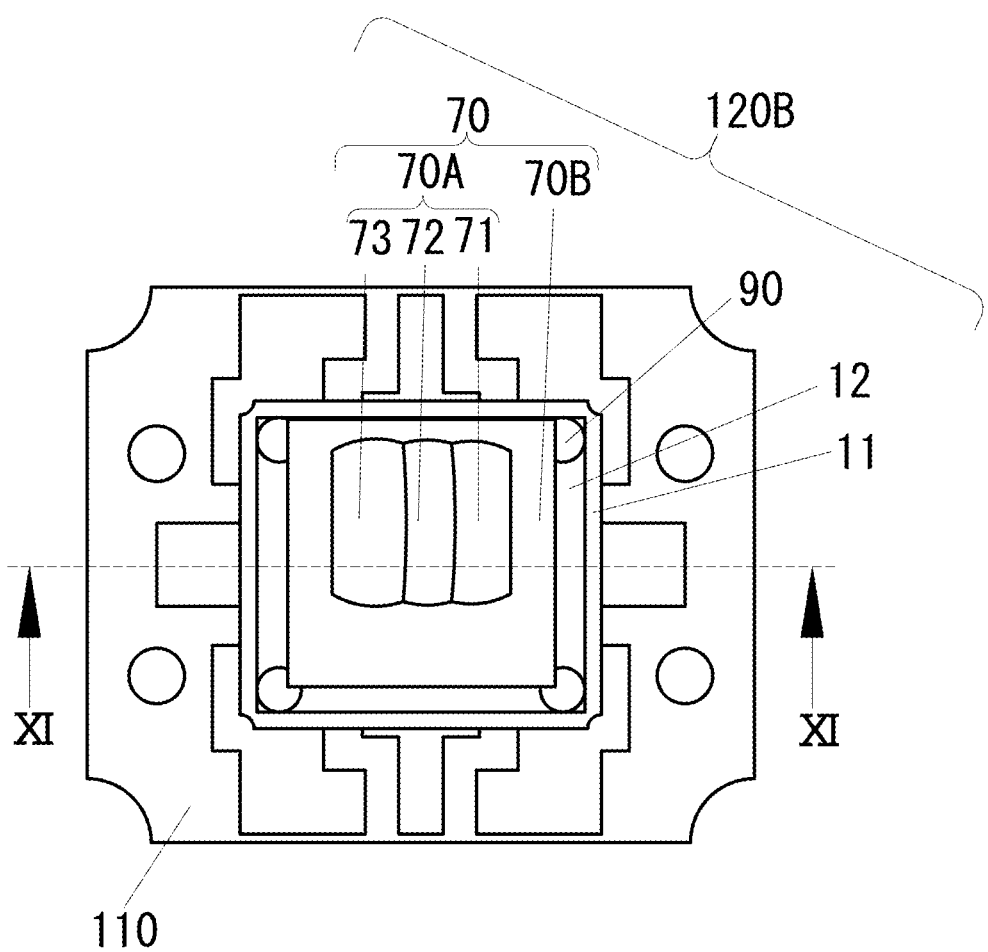
FIG. 10 is a view from the light extracting surface side of a light emitting device according to a second embodiment.
Figure 11:
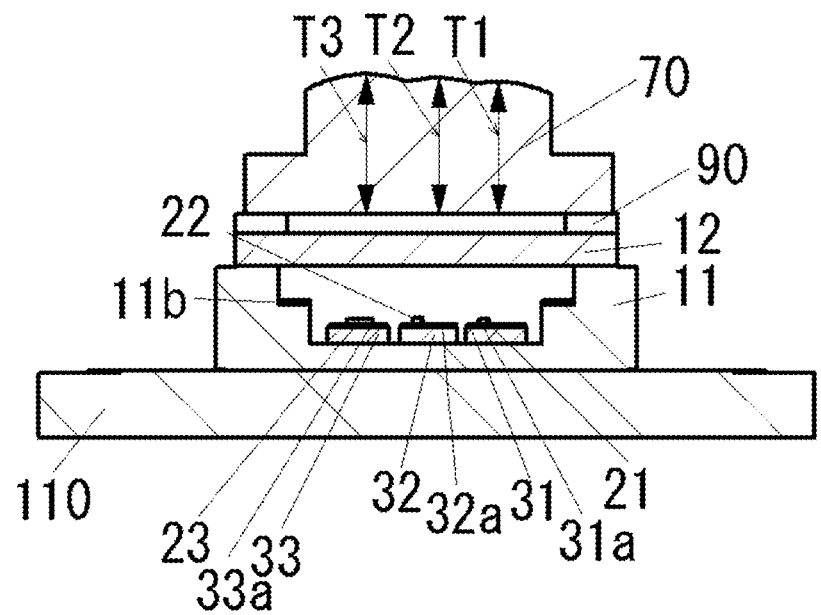
FIG. 11 is a section view along XI-XI of FIG. 10.
Figure 12:
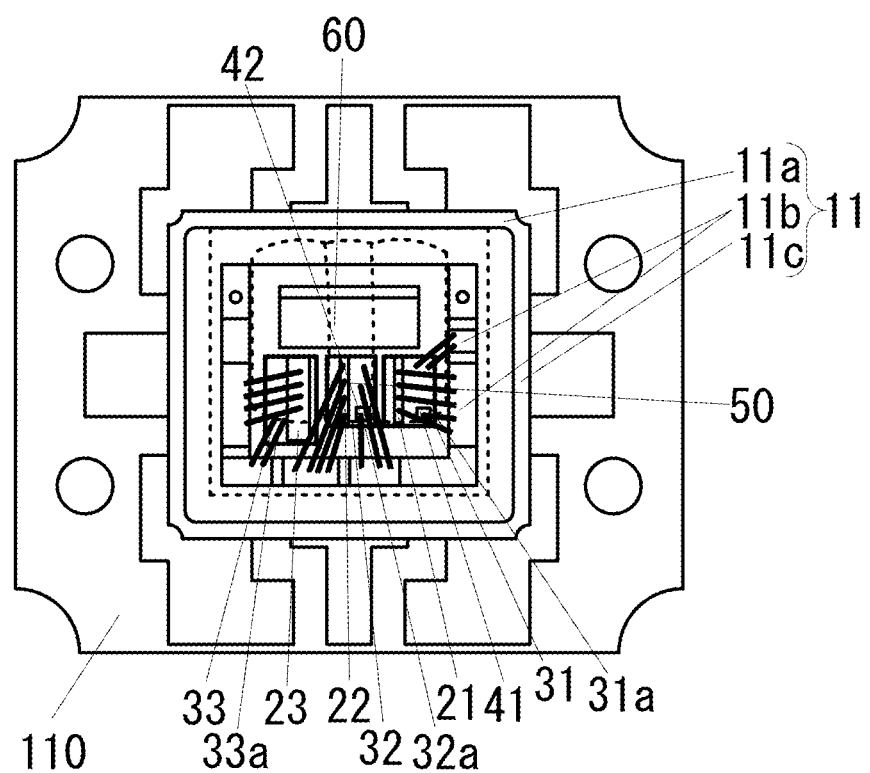
FIG. 12 is a view to describe inside of a recess of a base of the light emitting device according to the second embodiment.

FIG. 10 is a top view of a light emitting device 120B and the substrate 110 according to a second embodiment, and FIG. 11 is a section view along XI-XI of FIG. 10. Also, FIG. 12 is a top view to describe the inside of the recess of the base 11 of the light emitting device 120B. The light emitting device 120B is substantively the same as the features described in the light emitting device 120A, except the features described below.

In the light emitting device 120B, the green light emitting LD element is arranged between the blue light emitting LD element and the red light emitting LD element. In other words, in the light emitting device 120B, the first LD element 21 is the blue light emitting LD element, the second LD element 22 is the green light emitting LD element and the third LD element 23 is the red light emitting LD element. Therefore, in FIG. 10, the first lens portion 71 transmits blue light, the second lens portion 72 transmits green light and the third lens portion 73 transmits red light. Also, the height of the first lens portion 71, the second lens portion 72 and the third lens portion 73 are respectively different in the light emitting device 120B. Here, the thickness of the lens portions increases as the peak wavelength gets longer. The diffusion of the lights entered inside the lenses can be adjusted by changing the thickness of the lens portions, thus, the lights passed through the lens portions can be made approximately parallel light.

For example, the height of each lens portions can be in the range from 1 mm to 3 mm when the light incident surface of the lens portion is a planer surface and the light extracting surface is a curved surface. The condition at this time is T1<T2<T3. While shapes of the light incident surface and the light extracting surface of each lens portions are the same in FIG. 11, at least one of the shapes of the light incident surface and the light extracting surface with respect to each lens portions in the light emitting device 120B, can be different.

Third Embodiment

Figure 13:
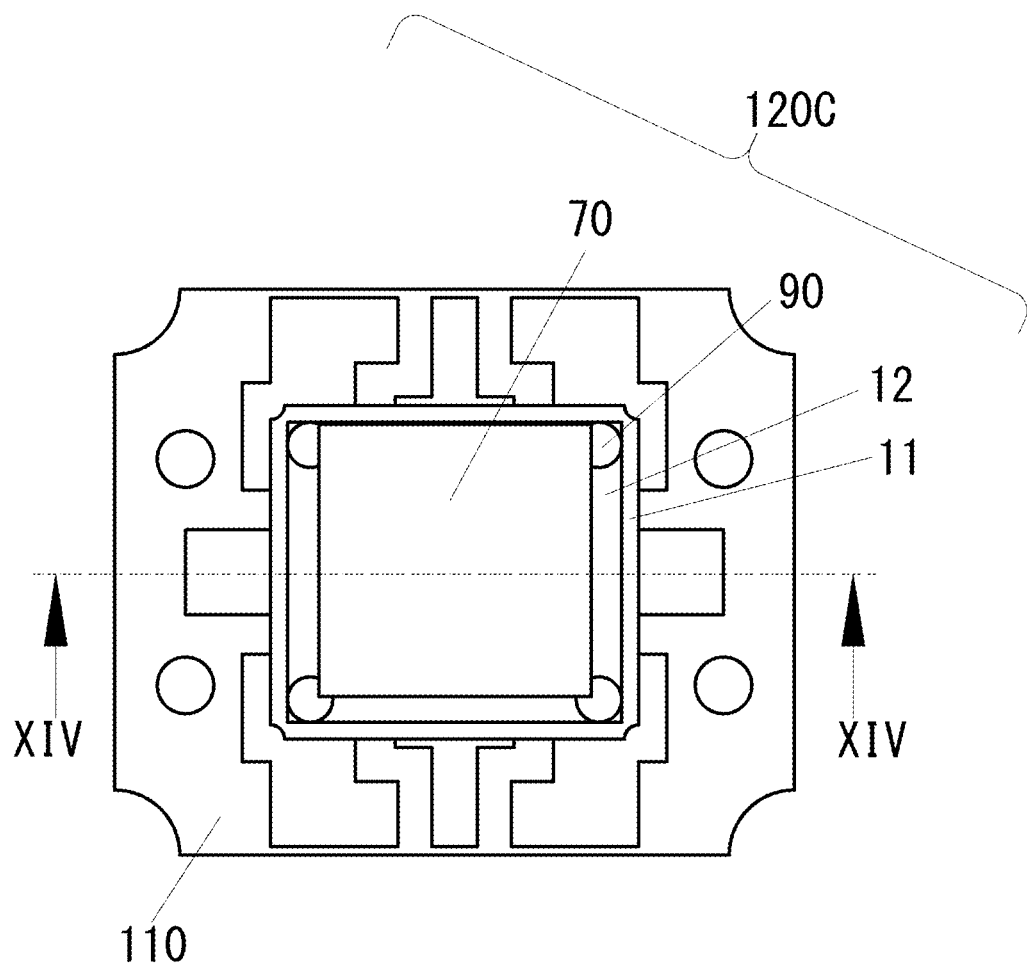
FIG. 13 is a view from the light extracting surface side of a light emitting device according to a third embodiment.
Figure 14:
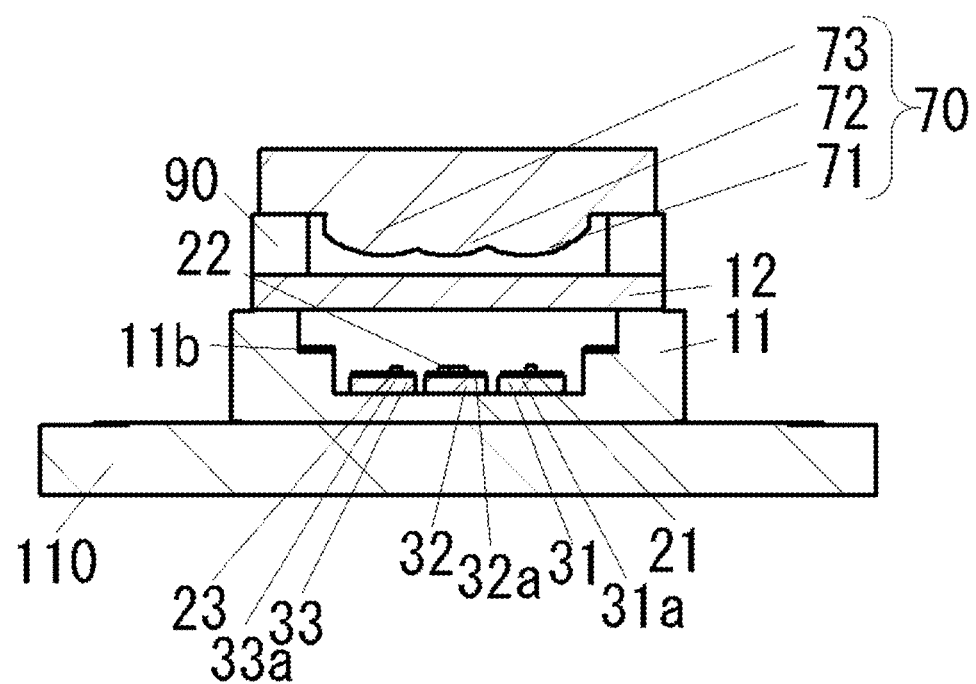
FIG. 14 is a section view along XIV-XIV of FIG. 13.

FIG. 13 is a top view of a light emitting device 120C and the substrate 110 according to a third embodiment, and FIG. 14 is a section view along XIV-XIV of FIG. 13. The light emitting device 120C is substantively the same as the features described in the light emitting device 120A, except the features described below.

In the light emitting device 120C, the shape of the light incident surface of the lens portion is different. Specifically, the first lens portion 71, the second lens portion 72 and the third lens portion 73 are provided on the lower surface side of the collimate lens 70 and the curvatures of each lens portions are respectively different. Also, the red light emitting LD element is arranged between the green light emitting LD element and the blue light emitting LD element. In other words, in the light emitting device 120C, the first LD element 21 is a blue light emitting LD element, the second LD element 22 is a red light emitting LD element and the third LD element 23 is a green light emitting LD element. Therefore, in FIG. 14, the first lens portion 71 transmits blue light, the second lens portion 72 transmits red light and the third lens portion 73 transmits green light. The light emitting device 120C is also capable to make each LD lights approximately parallel light with high accuracy and the whole device can be made small.

Figure 19:
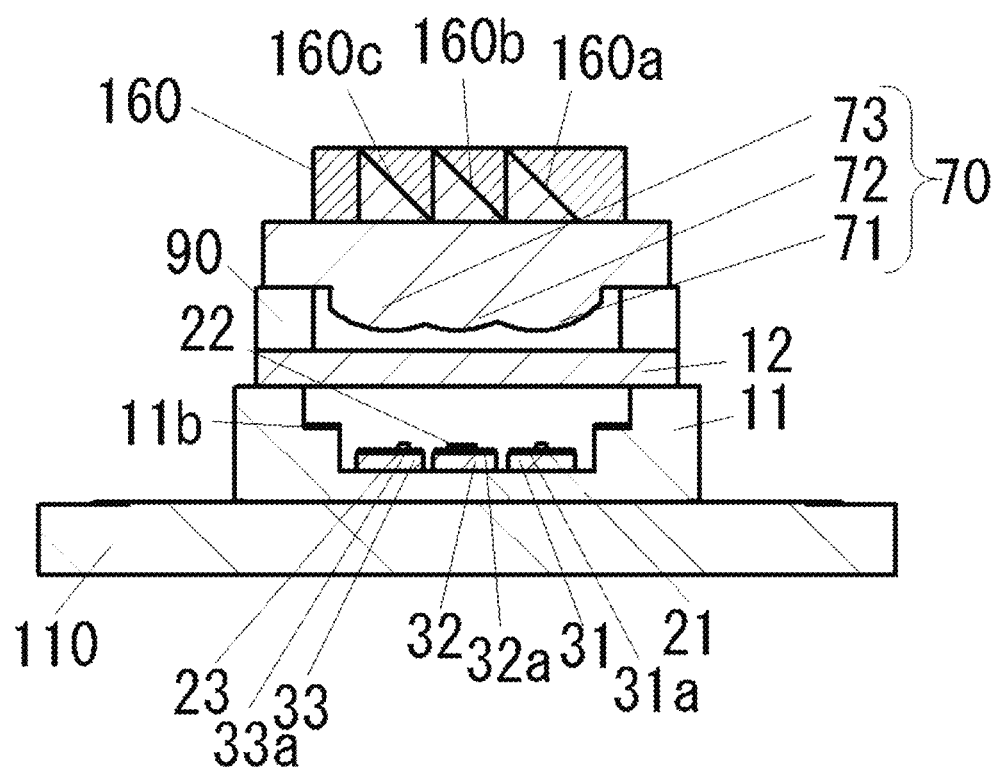
FIG. 19 is a cross-sectional view of a light emitting device according to a modified embodiment.

The light emitting device 120C may include a dichroic mirror 160 as shown in FIG. 19. In FIG. 19, the dichroic mirror 160 is disposed on the upper surface side of the collimate lens 70 of the light emitting device. Since the upper surface of the collimate lens 70 is a flat surface, the dichroic mirror 160 can be easily mounted on the upper surface of the collimate lens 70. As compared with the case of placing the dichroic mirror at a position away from the light emitting device 120C, by arranging the dichroic mirror 160 as shown in FIG. 19, it is possible to obtain a small footprint device. The dichroic mirror 160 has a plurality of reflective surfaces corresponding to each of the LD elements. The first reflective surface 160a reflects the light from the first LD element 21. The second reflective surface 160b transmits the light from the first LD element 21 reflected by the first reflective surface 160a, and reflects the light from the second LD element 22. The third reflective surface 160c transmits the light from the second LD element 22 reflected by the second reflective surface 160b and the light from the first LD element 21 reflected by the first reflective surface 160a, and reflects the light from the third LD element 23.

The dichroic mirror 160 may be bonded to the upper surface of the collimate lens 70 via an adhesive or the like. For example, the dichroic mirror 160 may be bonded to the collimate lens 70 as follows: first, the UV-curable adhesive that is the same as or similar to the adhesive 90 is applied to the upper surface of the collimate lens 70; second, the dichroic mirror 160 is disposed on the collimate lens 70 so that the dichroic mirror 160 contacts the adhesive; and third, the adhesive is cured by ultraviolet light irradiation. Prior to performing the ultraviolet light irradiation, the position of the dichroic mirror 160 may be adjusted by measuring the beam accuracy of the laser light emitted from the dichroic mirror 160 while the first LD element 21, the second LD element 22, and the third LD element 23 are driven. More specifically, the position of the dichroic mirror 160 at which optical axes of the first LD element 21, the second LD element 22, and the third LD element 23 coincide to the extent they fall within a predetermined range can be identified, and ultraviolet light irradiation can be performed at that position to cure the adhesive. Thus, it is possible to align the optical axis of the first LD element 21, the second LD element 22, and the third LD element 23 with high accuracy.

Fourth Embodiment

Figure 15:
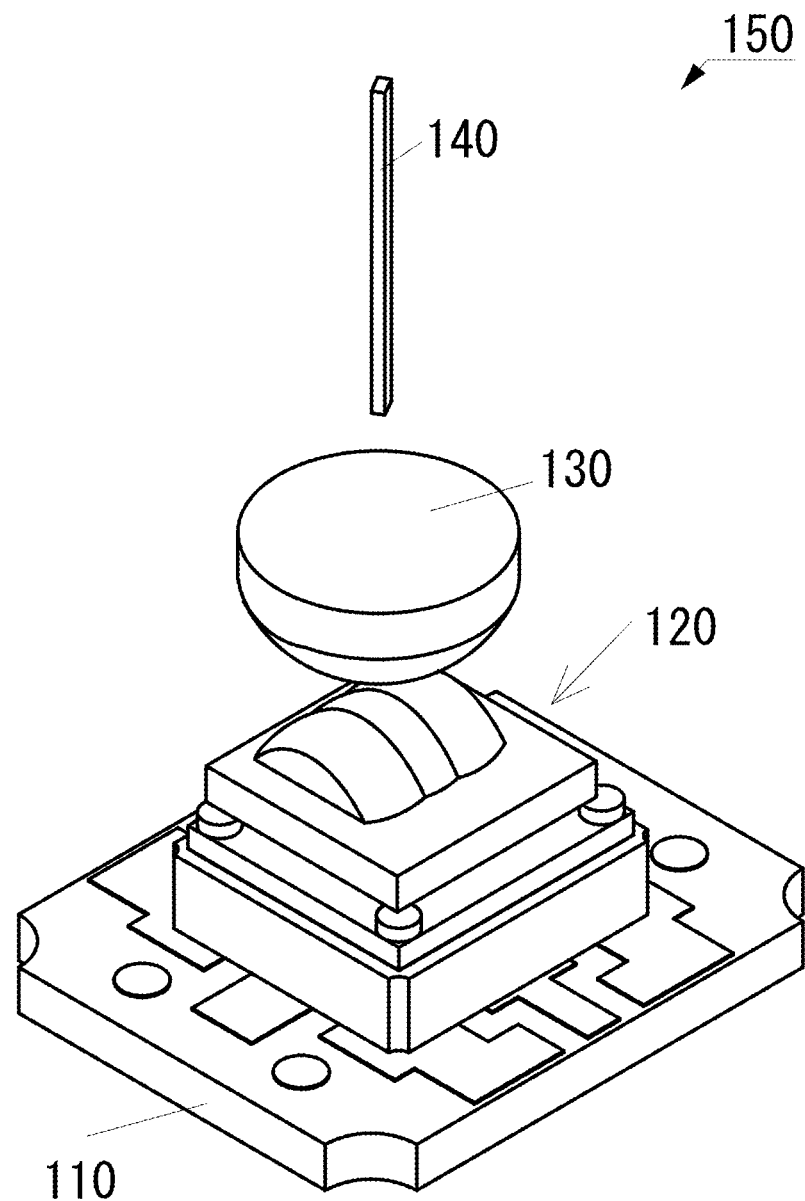
FIG. 15 is a perspective view of an optical apparatus according to a fourth embodiment.
Figure 16:
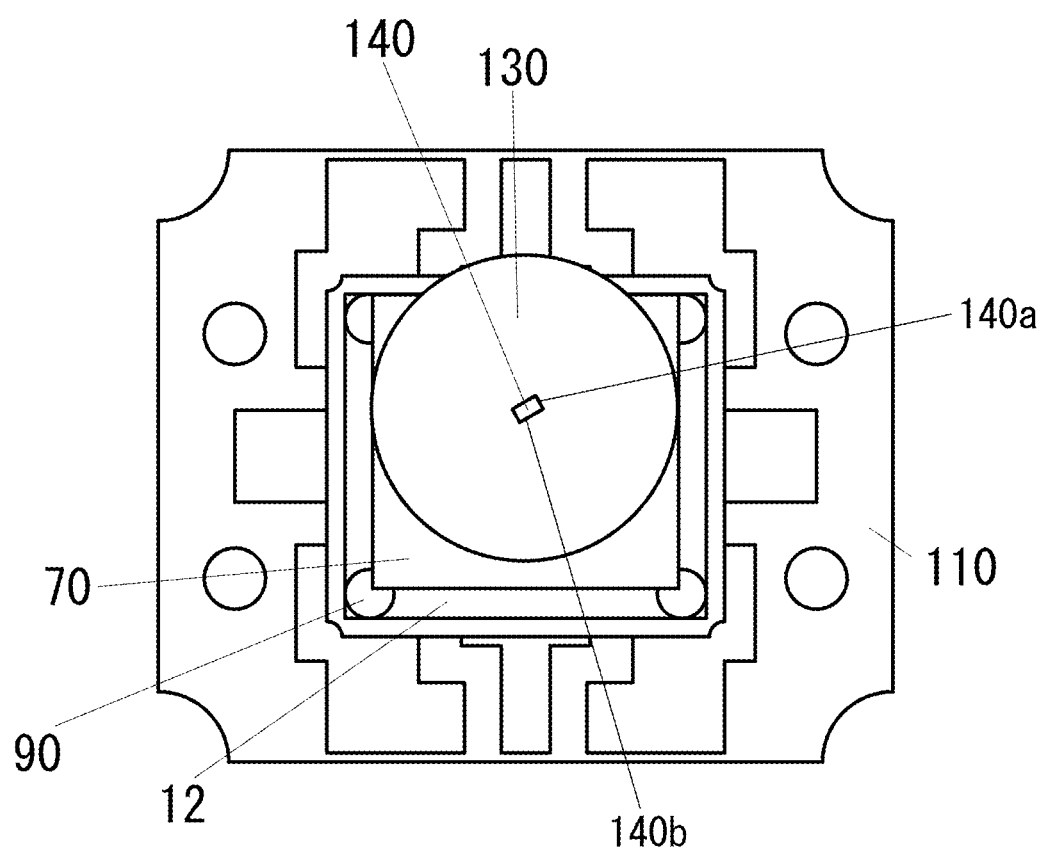
FIG. 16 is a view from the light exiting surface side of the optical apparatus according to the fourth embodiment.

FIG. 15 is a perspective view which schematically shows the positional relationship of a portion of elements of an optical apparatus 150 according to a fourth embodiment, and FIG. 16 shows a top view of the optical apparatus 150 shown in FIG. 15. The optical apparatus 150 includes the light emitting device 120, the collective lens 130 which collects the lights passed through the collimate lens 70, and the light pipe 140 through which the lights passed through the collective lens 130 pass. The light incident surface of the light pipe 140 is elongated in one direction. The direction in which the absolute value of spread angle of the first light is maximized, the direction in which the absolute value of spread angle of the second light is maximized and the direction in which the absolute value of spread angle of the third light is maximized are respectively parallel to a first direction when the lights enter the light pipe 140. The light pipe 140 is arranged so that the first direction in which the absolute values of the spread angles of the lights when entering the light pipe 140 and the shorter side direction of the light incident surface of the light pipe 140 intersect with each other. The light emitting device 120A, the light emitting device 120B or the light emitting device 120C can be used as the light emitting device 120. Meanwhile, the term, an absolute value of light spread angle, used herein refers a diffusion angle of a beam in a case the light enters the light pipe 140 without passing though the collective lens, and refers a convergent angle of a beam in a case the light enters the light pipe 140 via the collective lens. In other words, if the light emitting device 120A shown in FIG. 1-8 is used for the optical apparatus 150, the direction in which the absolute value of spread angle of the first light is maximized, the direction in which the absolute value of spread angle of the second light is maximized, and the direction in which the absolute value of spread angle of the third light is maximized, are the vertical direction of FIG. 16. In this embodiment, both of the light incident surface and the light exiting surface of the light pipe 140 are rectangles that have a pair of short sides 140a and a pair of long sides 140b. Therefore, as shown in FIG. 16, the light pipe 140 is arranged so that the shorter side direction (the direction parallel to the short sides 140a) of the light incident surface of the light pipe 140 intersects with the vertical direction of the figure.

The spread angle of the beam of each LD light is greater in the lamination direction of the plurality of semiconductor layers including an active layer than the spread angle in the direction perpendicular to that direction. If the direction in which the absolute value of spread angle is small and the longitudinal direction of the light incident surface of the light pipe 140 is parallel, the light with large spread angle mostly scatters in the shorter side direction of the light incident surface of the light pipe 140 when the beam enters the light pipe 140. However, since the light is hardly scattered inside the light pipe 140, in the direction in which the spread angle is small, the light pipe 140 with the length longer than a predetermined length will be needed to uniformly mix each LD lights. In contrast, by rotating the light pipe 140 and arranging the direction in which the absolute value of light spread angle is maximized when the light enters the light pipe 140 and the shorter side direction of the light incident surface of the light pipe 140 non-parallel by displacing, the light with greater diffusion hits against the inner surface of the light pipe 140 and it scatters in various directions. Accordingly, the light of each LD elements can be easily mixed and the colors can be mixed with a shorter light pipe 140 than when arranged in parallel.

Figure 17:
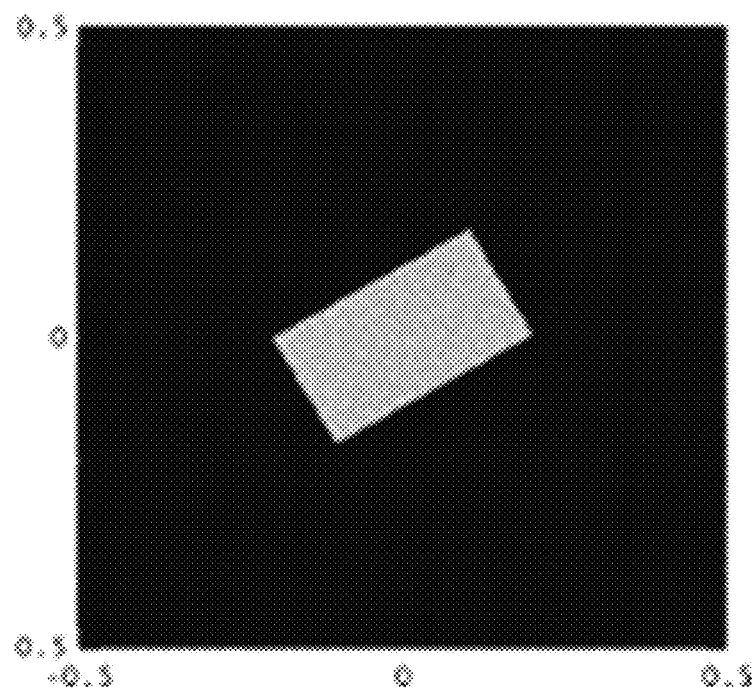
FIG. 17 is a result of ray-trace simulation with the optical apparatus according to the fourth embodiment.
Figure 18:
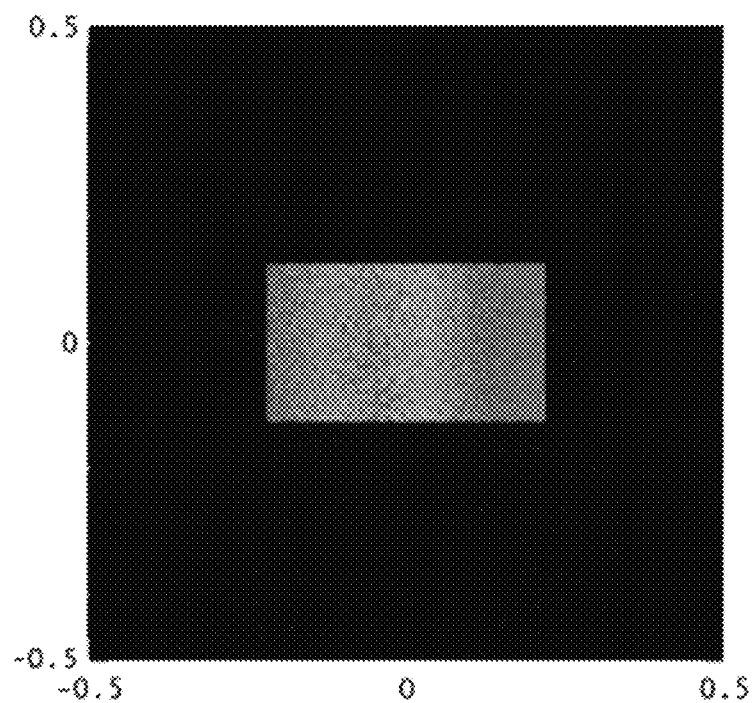
FIG. 18 is a result of ray-trace simulation as a comparative example.

A chromaticity distribution obtained by performing a ray-trace simulation on the light exiting surface of the light pipe 140 of the optical apparatus 150 is shown in FIG. 17. FIG. 18 shows a chromaticity distribution obtained by performing a ray-trace simulation on the light exiting surface of the light pipe 140 under the same condition with the optical apparatus 150 except that the direction in which the light spread angle when entering the light pipe is in the maximal value and the shorter side direction of the light pipe 140 are arranged in parallel. It is confirmed that the light pipe 140 with relatively short length according to the optical apparatus 150 can uniform the chromaticity on the light exiting surface of the light pipe 140 as shown in the results in FIG. 17 and FIG. 18.

When using the optical apparatus 150 for a projector, it is preferable to make the light exiting surface of the light pipe 140 rectangular. It is because the image projected by a projector is generally a rectangle, and thus, the light extracted from the light pipe 140 can be projected without any change by making the light exiting surface of the light pipe 140 rectangular.

The light emitting device and the optical apparatus recited in each embodiment can be used for projectors and the like.

What is claimed is:

1. An optical apparatus comprising:
   a light emitting device including
      a base including a main body portion containing a ceramic material and wire portions exposed from the main body portion on the lower surface of the base,
      a lid portion fixed to the base so that a hermetically sealed space is defined by the lid portion and the base,
      a first semiconductor laser element emitting blue light and provided in the hermetically sealed space,
      a second semiconductor laser element emitting red light and provided in the hermetically sealed space,
      a third semiconductor laser element emitting green light and provided in the hermetically sealed space, and
      a collimate lens arranged on paths of the blue light, the red light and the green light; and
   a substrate including first metallic films electrically connected with the base of the light emitting device via the wire portions.

2. The optical apparatus according to claim 1, wherein a part of the first metallic films locates on the outside of an outer rim of the base.

3. The optical apparatus according to claim 1, wherein the main body portion contains the ceramic material of aluminum oxide, aluminum nitride, silicon nitride or silicon carbide.

4. The optical apparatus according to claim 1, wherein the substrate includes a ceramic material.

5. The optical apparatus according to claim 4, wherein the ceramic material of the substrate contains aluminum oxide, aluminum nitride, silicon nitride or silicon carbide.

6. The optical apparatus according to claim 1, wherein the substrate includes through-holes.

7. The optical apparatus according to claim 1, wherein the substrate includes a second metallic film to secure the substrate.

8. The optical apparatus according to claim 1, further comprising a conductive member, wherein the base is fixed on the substrate via the conductive member.

9. The optical apparatus according to claim 8, wherein the conductive member is Au—Sn solder.

10. The optical apparatus according to claim 1, wherein the wire portion contains one or more of Cu, W and Au.

11. The optical apparatus according to claim 1, wherein the base includes a third metallic film provided on a top surface of the main body portion.

12. The optical apparatus according to claim 1, wherein the lid portion is a piece of glass provided with a metallic film or a piece of sapphire provided with a metallic film.

13. The optical apparatus according to claim 1, wherein the first semiconductor laser element includes a GaN-based semiconductor.

14. The optical apparatus according to claim 1, wherein the second semiconductor laser element includes an InAlGaP-based semiconductor or a GaAs-based semiconductor.

15. The optical apparatus according to claim 1, wherein the third semiconductor laser element includes a GaN-based semiconductor.

* * * * *